(12) United States Patent
Conti et al.

(10) Patent No.: US 8,836,111 B2
(45) Date of Patent: Sep. 16, 2014

(54) SEMICONDUCTOR INTEGRATED DEVICE ASSEMBLY AND RELATED MANUFACTURING PROCESS

(71) Applicants: STMicroelectronics S.r.l., Agrate Brianza (IT); STMicroelectronics International N.V., Amsterdam (NL)

(72) Inventors: Sebastiano Conti, Mistretta (IT); Benedetto Vigna, Potenza (IT)

(73) Assignees: STMicroelectronics S.r.l., Agrate Brianza (IT); STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/916,416

(22) Filed: Jun. 12, 2013

(65) Prior Publication Data

US 2013/0334627 A1    Dec. 19, 2013

(30) Foreign Application Priority Data

Jun. 14, 2012    (IT) ............................... TO2012A0515

(51) Int. Cl.
| | | |
|---|---|---|
| H01L 23/053 | (2006.01) | |
| H01L 23/52 | (2006.01) | |
| H01L 21/52 | (2006.01) | |
| B81C 1/00 | (2006.01) | |
| H04R 19/00 | (2006.01) | |
| B81B 3/00 | (2006.01) | |

(52) U.S. Cl.
CPC ........... *B81B 3/0021* (2013.01); *B81C 1/00158* (2013.01); *H04R 19/005* (2013.01)
USPC ...................... 257/724; 257/E23.169; 438/52

(58) Field of Classification Search
None
See application file for complete search history.

(56) References Cited

U.S. PATENT DOCUMENTS

| | | | |
|---|---|---|---|
| 7,102,220 B2 * | 9/2006 | Stevens et al. ................ | 257/686 |
| 7,166,917 B2 * | 1/2007 | Yang et al. .................... | 257/724 |
| 7,736,946 B2 * | 6/2010 | Seppala et al. ................ | 438/106 |
| 7,999,197 B1 * | 8/2011 | Sawyer et al. ................ | 174/522 |
| 8,264,074 B2 * | 9/2012 | Kim et al. ..................... | 257/686 |
| 2007/0158826 A1 * | 7/2007 | Sakakibara et al. .......... | 257/723 |
| 2010/0086164 A1 | 4/2010 | Gong et al. | |
| 2010/0289131 A1 | 11/2010 | Bathan et al. | |
| 2012/0056316 A1 | 3/2012 | Pagaila et al. | |
| 2012/0153771 A1 | 6/2012 | Formosa et al. | |
| 2013/0032936 A1 | 2/2013 | Formosa | |

FOREIGN PATENT DOCUMENTS

| | | |
|---|---|---|
| EP | 2 393 306 A2 | 12/2011 |
| EP | 2 393 307 A2 | 12/2011 |
| WO | 2011/076910 | 6/2011 |

OTHER PUBLICATIONS

Italian Search Report, dated Feb. 11, 2013 for Italian application No. TO20120515, 7 pages.

* cited by examiner

*Primary Examiner* — Thomas L Dickey
*Assistant Examiner* — Joseph Schoenholtz
(74) *Attorney, Agent, or Firm* — Seed IP Law Group PLLC (57) ABSTRACT

Described herein is a semiconductor integrated device assembly, which envisages: a package defining an internal space; a first die including semiconductor material; and a second die, distinct from the first die, also including semiconductor material; the first die and the second die are coupled to an inner surface of the package facing the internal space. The second die is shaped so as to partially overlap the first die, above the inner surface, with a portion suspended in cantilever fashion above the first die, by an overlapping distance.

20 Claims, 7 Drawing Sheets

SEMICONDUCTOR INTEGRATED DEVICE ASSEMBLY AND RELATED MANUFACTURING PROCESS

BACKGROUND

1. Technical Field

The present disclosure relates to a semiconductor integrated device assembly and to a related manufacturing process. In particular, the following description will refer, without this implying any loss of generality, to the assembly of an acoustic transducer of a MEMS (microelectromechanical system) type.

2. Description of the Related Art

As acoustic transducer, for example a MEMS microphone of a capacitive type, generally comprises a micromechanical sensing structure, designed to transduce acoustic pressure waves into an electrical quantity (in the example a capacitive variation), and a reading electronics, designed to carry out appropriate processing operations (amongst which operations of amplification and filtering) of the electrical quantity to supply an electrical output signal, for example a voltage.

Figure 1:
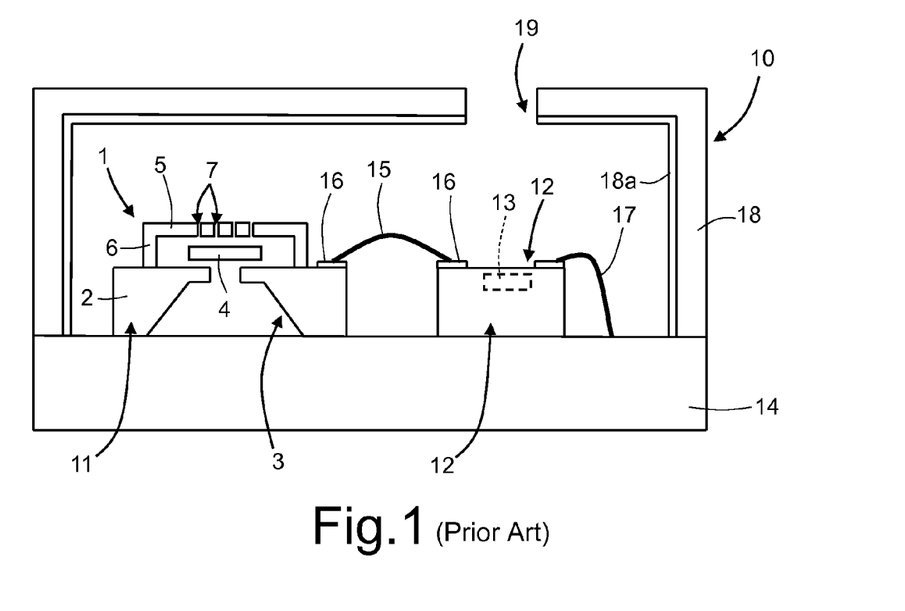
FIG. 1 shows a schematic cross-sectional view of an integrated device, in particular a MEMS acoustic transducer, with the corresponding package.

In greater detail, and with reference to FIG. 1, a micromechanical sensing structure 1 of a MEMS acoustic transducer comprises a structural layer 2 of semiconductor material, for example silicon, in which a cavity 3 is obtained, for example via chemical etching from the back. A membrane 4, or diaphragm, is coupled to the structural layer 2 and closes the cavity 3 at the top; the membrane 4 is flexible and, in use, undergoes deformation as a function of the pressure of incident sound waves. A rigid plate 5 (generally known as "backplate") is set above the membrane 4 and facing the latter, via interposition of spacers 6 (for example, made of insulating material, such as silicon oxide). The rigid plate 5 constitutes the fixed electrode of a variable-capacitance detection capacitor, the mobile electrode of which is constituted by the membrane 4, and has a plurality of holes 7, designed to enable free circulation of air towards the same membrane 4 (making the rigid plate 5 "acoustically transparent"). The micromechanical sensing structure 1 further comprises (in a way not illustrated) membrane and rigid-plate electrical contacts, used for biasing the membrane 4 and the rigid plate 5 and collecting a capacitive variation signal as a consequence of the deformation of the membrane 4 caused by the incident acoustic pressure waves.

The sensitivity of the MEMS acoustic transducer depends on the mechanical characteristics of the membrane 4 of the micromechanical sensing structure 1 (in particular upon its so-called mechanical "compliance"), and the type of assembly of the membrane 4 and of the rigid plate 5.

In addition, the volume of the front acoustic chamber, the so-called "front chamber" (i.e., the space traversed in use by the acoustic pressure waves coming from the external environment through an appropriate access port), and the volume of the rear acoustic chamber, the so-called "back chamber" (i.e., the space that is located on the opposite side of the front chamber with respect to the membrane 4, set in use at a reference pressure) directly affect the acoustic performance of the transducer.

In particular, the volume of the front chamber determines the upper resonance frequency of the acoustic transducer, and hence its performance at high frequencies (in fact, the operating frequency band of the acoustic transducer has to be lower than the resonance frequency of the oscillations of air). In general, the smaller the volume of the front chamber, the higher the upper cut-off frequency of the transducer in so far as the resonance frequency of the oscillations of the air shifts towards higher frequencies.

The back chamber behaves, instead, as a closed volume subject to compression, with the consequence that the smaller the volume of the back chamber, the lower the sensitivity of the acoustic transducer (in fact, it is as if the deformations of the membrane were hindered by the action of a spring of high stiffness). It is hence desirable in general to provide a back chamber of large dimensions so as to improve the sensitivity of the acoustic transducer.

The volume of the front chamber and/or of the back chamber of the MEMS acoustic transducer depend not only upon the configuration of the micromechanical sensing structure 1, but also upon the conformation of the related package, i.e., the container, casing, or coating, which surrounds, totally or in part, the die or dice of semiconductor material of the acoustic transducer, enabling electrical connection thereof from outside. The package is configured to house not only the micromechanical sensing structure 1 itself, but also the reading electronics associated thereto, generally provided as an ASIC (application-specific integrated circuit), integrated in a respective die of semiconductor material.

FIG. 1 shows by way of example a package solution for the MEMS acoustic transducer, here designated as a whole by 10, housing a first die 11, integrating the microelectromechanical structure 1, and moreover a second die 12, which also includes semiconductor material, integrating an ASIC, electrically coupled to the microelectromechanical structure 1 and designated as a whole by 13.

In this solution, the first and second dice 11, 12 are coupled side by side on a substrate 14 of the package. Electrical connections 15 between the first and second dice 11, 12 are provided with the wire-bonding technique between corresponding contact pads, designated as a whole by 16, whilst appropriate metallization layers and vias (not shown in detail) are provided in the substrate 14 for routing the electrical signals towards the outside of the package. Further electrical connections 17, obtained with the wire-bonding technique, are provided between the second die 12 and a top face of the substrate 14, coupled to which are the same dice 11, 12.

A cap 18 of the package is also coupled to the substrate 14, enclosing inside it the first and second dice 11, 12. The cap 18 may be made of metal or pre-molded plastic with an internal coating metallization layer 18a so as to prevent the disturbance of external electromagnetic signals (by providing a sort of Faraday cage). The cap 18 has an opening 19 to enable introduction of an air flow from the outside and of acoustic pressure waves.

Electrical contact elements (not shown), for example, in the form of conductive lands or bumps, are provided on the bottom part of the substrate 14 for soldering and electrical connection to an external printed circuit.

There are several constraints imposed on the assembly of a MEMS acoustic transducer, which render particularly problematical the design thereof, in particular in the case where extremely compact dimensions are utilized, as, for example, in the case of portable applications.

Figure 2:
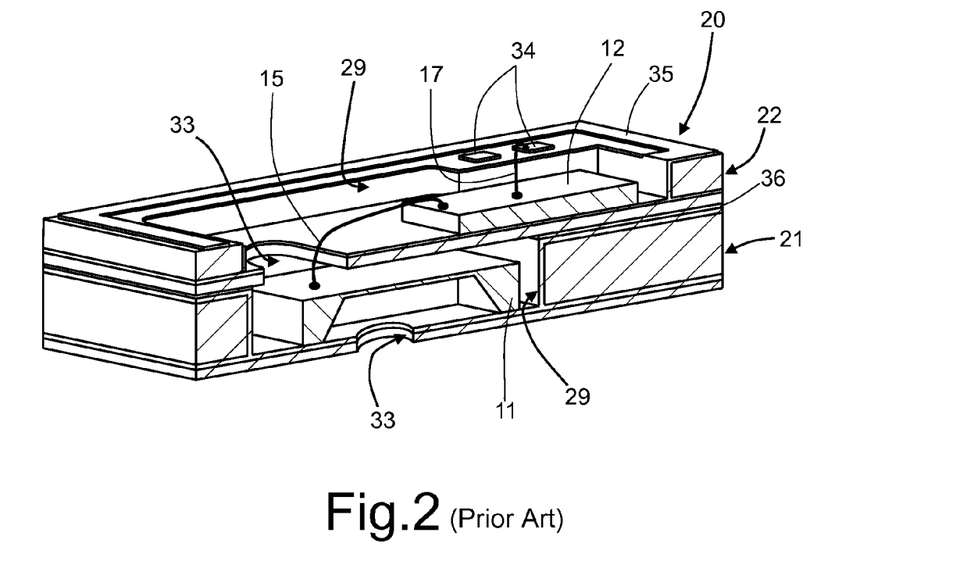
FIG. 2 shows a perspective cross-sectional view of an assembly of a MEMS acoustic transducer.

In order to reduce the lateral encumbrance, in the U.S. patent publication No. 2013/0032936 filed in the name of the present Applicant on Jun. 30, 2011, a vertically stacked packaging structure has been proposed, represented and designated by 20 in FIG. 2, comprising a first composite substrate 21 and a second composite substrate 22, which are stacked and fixed on one another, each carrying a respective die 11, 12 of the MEMS acoustic transducer.

Figure 3A:
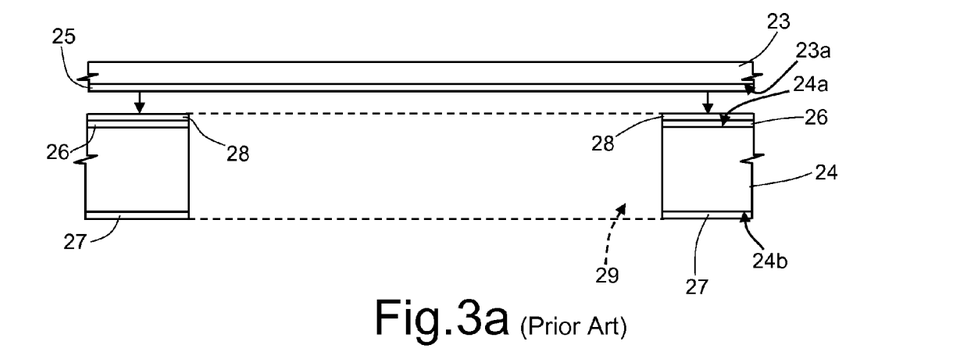
FIGS. 3a-3c are cross-sectional views of a composite substrate of the transducer of FIG. 2, in successive steps of a related manufacturing process.
Figure 3B:
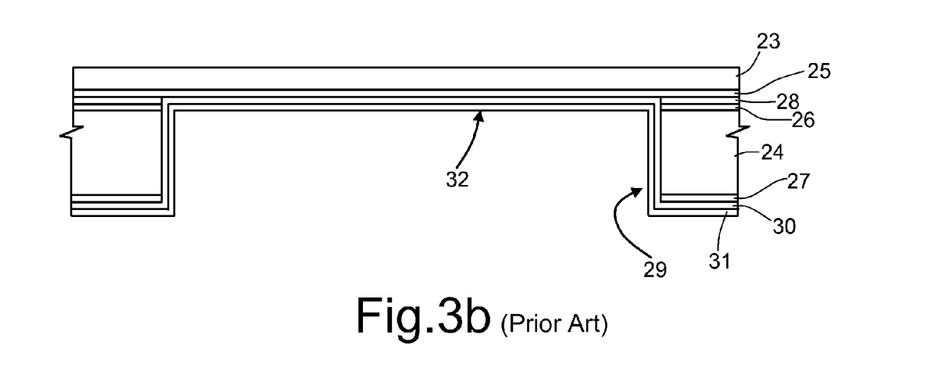
Figure 3C:
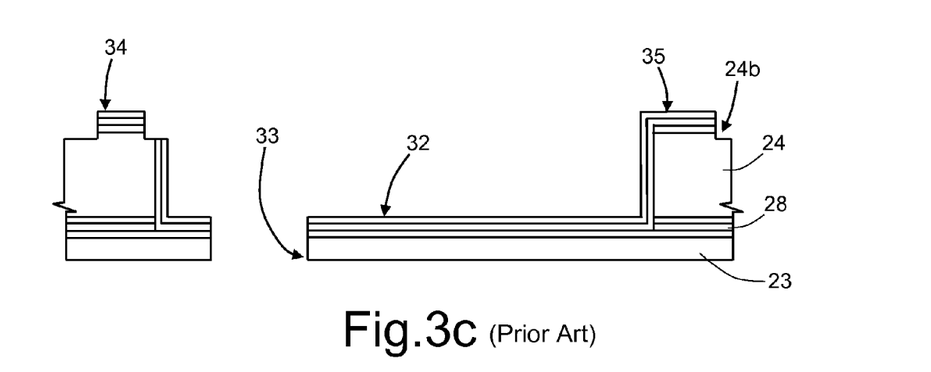

Each composite substrate 21, 22, shown schematically in FIG. 2, is obtained as described in FIGS. 3a-3c, using the technology described in detail in the U.S. patent publication No. 2012/0153771 filed in the name of the present Applicant.

In particular, FIG. 3a illustrates the coupling of a base layer 23 and of a wall layer 24 made of a same plastic material, in particular an epoxy resin, specifically a laminated BT (bis-maleimide triazine). A first main face 23a of the base layer 23 and a first main face 24a and a second main face 24b of the wall layer 24 are coated, using standard techniques, by respective thin metal layers 25, 26, 27. In addition, an adhesion layer 28, made of non-conductive adhesive material, is formed, for example, on the metal layer 26 that coats the first main face 24a of the wall layer 24, which is to be fixed to the base layer 23.

A chamber 29 has been formed (e.g., via a conventional chemical etching or laser drilling process) throughout the thickness of the wall layer 24 so as to remove locally also the metal layers 26, 27 and the adhesion layer 28.

Next, as indicated by an arrow in FIG. 3a, the base and wall layers 23, 24 are joined together, in a stacked manner, so as to form a composite substrate, illustrated in FIG. 3b. In this way, a chamber is formed, once again designated by the number 29 for simplicity, having side walls, defined by the wall layer 24, and a bottom, defined by the base layer 23.

A seed layer 30 is made to grow on the remaining portions of the metal layer 27 on the second main face 24b of the wall layer 24, on the side walls and on the bottom of the chamber 29. Next, for example using an electroplating technique or a sputtering technique, on the seed layer 30 a second metal layer 31 is made to grow, which coats, in particular, the inside of the chamber 29, to form, together with the layers 25, 27 and 30, a coating layer 32, also coating the walls and the bottom of the chamber 29.

Then, FIG. 3c (which shows the composite substrate set upside down), using standard micromachining techniques, an opening 33 is formed through the base layer 23 and the coating layer 32.

The coating layer 32 is also suitably processed, in a region corresponding to the second main face 24b of the wall layer 24, in such a way as to define electrical-contact structures, and in particular contact pads 34 and, more externally, a frame-shape contact region 35 (designed to enable provision of an electromagnetic shield, when connected to an appropriate reference potential).

As shown in FIG. 2, the composite substrates 21, 22 are stacked vertically by interposition of an adhesive layer 36, and have a different extension of the respective chamber 29, so that the respective dice 11, 12, housed in the chamber, are staggered laterally and in part vertically set one above the other. In particular, the first composite substrate 21 houses, within the respective chamber 29, the first die 11 integrating the microelectromechanical structure 1 (here not shown), and the second composite substrate 22 houses, within the respective chamber 29, the second die 12 integrating the ASIC 13 (here not shown).

The access opening 33 of the first composite substrate 21 enables access of the acoustic waves into the stacked package structure, whereas the respective access opening 33 of the second composite substrate 22 sets the respective chambers 29 in communication, and in particular enables electrical connection between the dice 11, 12 through the electrical connections 15. The further electrical connections 17 connect the second die 12 to the contact pads 34 carried by the side wall of the second composite substrate 22.

In a way not illustrated in FIG. 2, a base substrate is also set on top of the second composite substrate 22 (with a function similar to that of substrate 14 of FIG. 1), through which electrical connections are provided between the contact pads 34 and the outside of the package structure.

The package structure described has the advantage of reducing the overall dimensions of the MEMS acoustic transducer, thanks to the vertical stacking of the corresponding dice.

BRIEF SUMMARY

The present Applicant has realized that the solution described above is somewhat complex to manufacture, due to the formation and stacked coupling of the two composite substrates. In addition, the dimensions of the acoustic chambers of the transducer generally are not optimized, and the freedom in designing the same acoustic chambers may prove limited.

One embodiment of the present disclosure is to reduce the overall dimensions and optimization of the resulting electrical characteristics.

According to the present disclosure, a semiconductor integrated device assembly and a related manufacturing process are consequently provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 4:
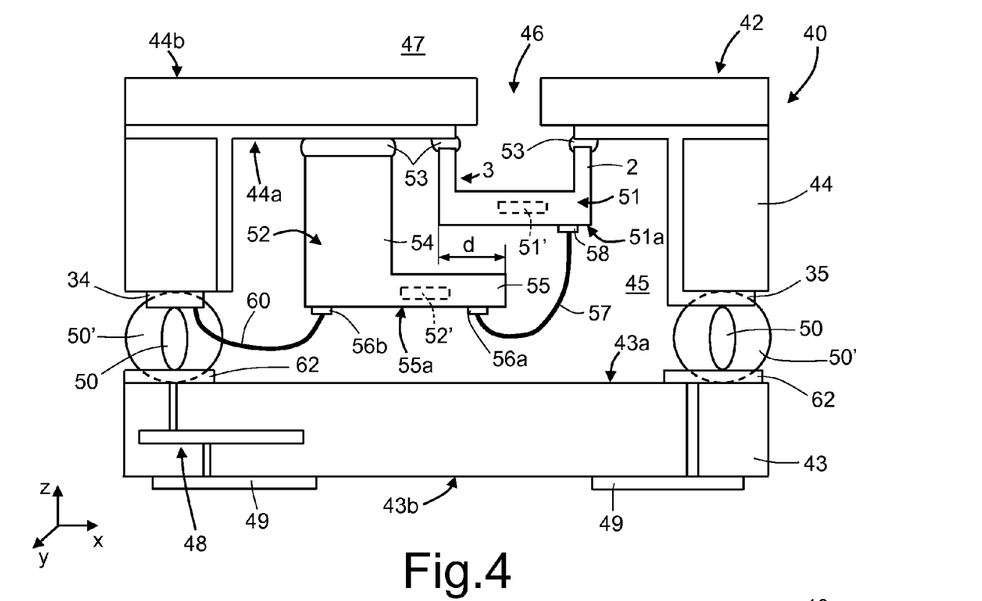
FIG. 4 shows a schematic cross-sectional view of a semiconductor integrated device assembly with the corresponding package, according to a first embodiment of the present disclosure.

FIG. 4 shows an integrated semiconductor device, designated as a whole by 40, provided with a package 42, comprising a base substrate 43 and a cap element 44, with a substantially cup-shaped conformation, coupled to the base substrate 43 to define an empty internal space 45 within the package 42. Through the cap element 44, in particular throughout the thickness of a bottom wall thereof, an access opening 46 is provided, designed to set the internal space 45 in fluid communication with the external environment, designated as a whole by 47 (the access opening 46 constitutes the only outlet for the internal space 45).

In particular, the cap element 44 is a composite substrate, altogether equivalent to the composite substrates 21, 22 described with reference to FIG. 2, and hence obtained as described in FIGS. 3a-3c.

The base substrate 43 is, for example, constituted by a multilayer structure, made up of one or more layers of conductive material (generally metal) separated by one or more dielectric layers (for, example constituted by a laminated BT—bismaleimide triazine); electrical paths, designated as a whole by 48, are provided through the base substrate 43, for example in the form of through vias and metal paths, for connecting an inner surface 43a thereof, facing the internal space 45, to an outer surface 43b thereof, facing the external environment 47, which carries appropriate electrical-connection elements, designated as a whole by 49, for example in the form of an array of balls or bumps (in the case of packages of the so-called BGA—ball-grid array—type) or lands (in the case of packages of the so-called LGA—land-grid array—type, as is the case illustrated in FIG. 4).

In particular, the cap element 44 is coupled to the base substrate 43 on top of its inner surface 43a, for example with the bonding technique, by means of coupling elements 50, for example in the form of conductive balls, or bumps, of solder paste. The coupling elements 50 are set at appropriate contact regions on end portions of side walls of the cap element 44 (in detail, in a position corresponding to the electrical-contact structures, i.e., the contact pads 34 and the frame-shaped contact region 35, of the cap element 44; see in this regard also the foregoing discussion).

Sealing regions 50' are moreover provided between the various coupling elements 50 so as to insulate the coupling elements 50 themselves from one another and seal hermetically (it is preferred that voids are not present, which could jeopardize acoustic operation) the coupling between the cap element 44 and the base substrate 43, all along a corresponding coupling perimeter, for example having a square or rectangular shape in plan view. Advantageously, both the coupling elements 50 and the sealing regions 50' may be provided starting from one and the same material, for example a special resin, such as the ACP (Anisotropic Conductive Paste, supplied by ThreeBond Co., Ltd.), which, subjected to a single pressing process, in the presence of a known magnetic field oriented in a vertical direction z (i.e., the direction of coupling between the cap element 44 and the base substrate 43), may be rendered conductive in the vertical direction z and non-conductive in the horizontal direction (i.e., along the directions of separation between the various coupling elements 50 in the horizontal plane xy).

The package 42 houses a first die, here designated by 51, which includes semiconductor material (for example silicon), and integrates a microelectromechanical structure 51' (illustrated schematically), and a second die 52, which includes semiconductor material (for example silicon), is functionally and electrically coupled to the first die 51 and integrates an ASIC 52' (which is also illustrated schematically). For example, the first die 51 integrates the detection structure of a MEMS acoustic transducer, altogether equivalent to what has been described with reference to FIG. 1 (to which reference is made), and the second die 52 integrates a corresponding electronic circuit for processing and conditioning the detected electrical quantities.

In particular, the first die 51 is arranged in the package 42 so that the corresponding structural layer (designated once again by 2 by analogy with what has been discussed with reference to FIG. 1) is in contact with an inner surface 44a of the cap element 44, set facing the internal space 45, being coupled thereto for example by means of an adhesion region (the so-called "die attach" region) 53, made of adhesive material, and so that the corresponding cavity 3 faces and is in direct fluid communication with the access opening 46 provided through the cap element 44.

In particular, the extension (in the horizontal plane xy) of the cavity 3 is greater than the corresponding extension of the access opening 46 so that the same access opening 46 communicates entirely with the cavity 3 (without directly giving out into the internal space 45 of the package 42). The cavity 3 represents, for example, the front chamber of the MEMS acoustic transducer.

The second die 52 is also coupled to the inner surface 44a of the cap element 44, by means of a respective adhesion region 53.

According to an aspect of the present disclosure, the second die 52 is shaped in such a way as to be partially superimposed vertically (in the vertical direction z, orthogonal to the horizontal plane xy) above the first die 51. In particular, the second die 52 comprises a supporting portion 54, having a pillar conformation, extending in the vertical direction z, and having a first end attached to the inner surface 44a of the cap element 44 by means of the respective adhesion region 53.

The second die 52 further comprises a functional portion 55, which extends at a distance from the inner surface 44a of the cap element 44, suspended in cantilever fashion (defining a so-called "cantilever") starting from a second end of the supporting portion 54, opposite to the first end in the vertical direction z, in such a way as to be partially superimposed vertically above the first die 51 by an overlapping distance d (measured in the horizontal plane xy). The functional portion 55 integrates appropriate electronic elements (such as transistors, diodes, resistors, etc.) which define the ASIC 52', and has an outer surface 55a, opposite to the supporting portion 54, which carries first and second electrical contact pads 56a, 56b.

Advantageously, this arrangement enables reduction of the horizontal dimensions of the assembly (in a direction parallel to the outer surface 43b designed for electrical contact from the external environment 47, and in general to the horizontal plane xy), by a factor that corresponds substantially at least to the overlapping distance d.

In the case of a MEMS acoustic transducer, the back chamber moreover has a large volume, in fact substantially corresponding to the internal space 45 defined in the package 42.

As it will be evident, the vertical extension (height) of the supporting portion 54 of the second die 52 is greater than the corresponding vertical extension of the first die 51. In addition, the lateral extension, in the horizontal plane xy, of the functional portion 55 of the second die 52 is greater than the corresponding lateral extension of the supporting portion 54.

The electrical connections between the ASIC 52' in the second die 52 and the microelectromechanical structure 51' in the first die 51 are provided with the wire-bonding technique, with electrical wires 57 that extend between the first contact pads 56a of the second die 52 and contact pads 58 carried by an outer surface 51a of the first die 51, opposite to the structural layer 2 in contact with the cap element 44.

In addition, in a way similar to what has been described, for example, in the aforesaid patent application No. WO 2011/076910, the electrical connections between the ASIC 52' in the second die 52 and the base substrate 43 (and the corresponding electrical paths 48 towards the electrical-connection elements 49 for the external environment 47) are also provided by means of the wire-bonding technique, with further electrical wires 60 that extend between the second contact pads 56b of the second die 52 and the coupling elements 50 and corresponding contact regions on the end portions of the side walls of the cap element 44 (for example, the contact pads 34). The base substrate 43 may carry on the inner surface 43a further electrical contacts 62, facing the coupling elements 50, in such a way as to transfer the electrical signals towards the electrical paths 48.

Alternatively, the electrical wires 60 may provide a direct electrical connection between the ASIC 52' in the second die 52 and the electrical contacts 62 on the base substrate 43.

Figure 5:
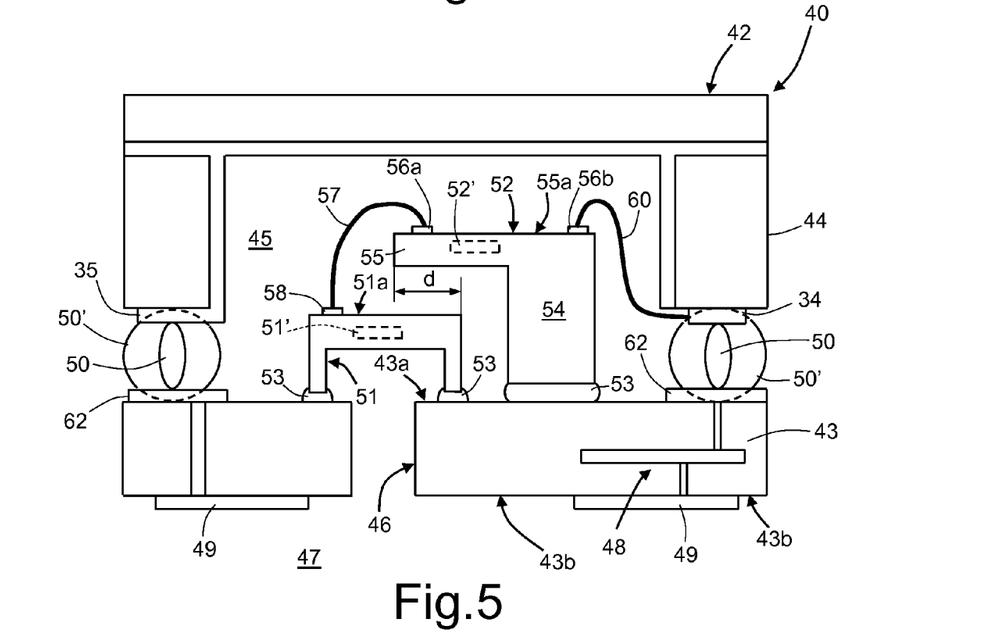
FIG. 5 shows a schematic cross-sectional view of a semiconductor integrated device assembly with the corresponding package, according to a second embodiment of the present disclosure.

FIG. 5 shows a different embodiment of the integrated semiconductor device, once again designated by 40.

This embodiment differs from the one described with reference to FIG. 4 due to the fact that both the first die 51 and the second die 52 are coupled to the inner surface 43a of the base substrate 43. Once again, the dice 51, 52 are set side by side, with the second die 52 at least partially superimposed vertically on the first die 51 by the overlapping distance d.

In this case, the access opening 46 for fluidic access towards the inside of the package 42 is provided through the entire thickness of the base substrate 43, instead of being provided through the bottom wall of the cap element 44, which is here completely continuous and without any interruptions.

Figure 6A:
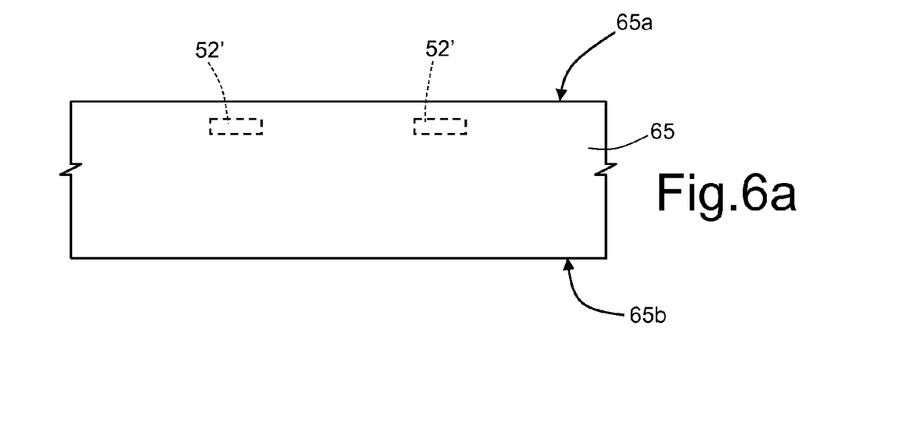
FIGS. 6a-6c are cross-sectional views of a wafer of semiconductor material, in successive steps of a first variant of the process for manufacturing a die of the device of FIG. 4 or FIG. 5.
Figure 6B:
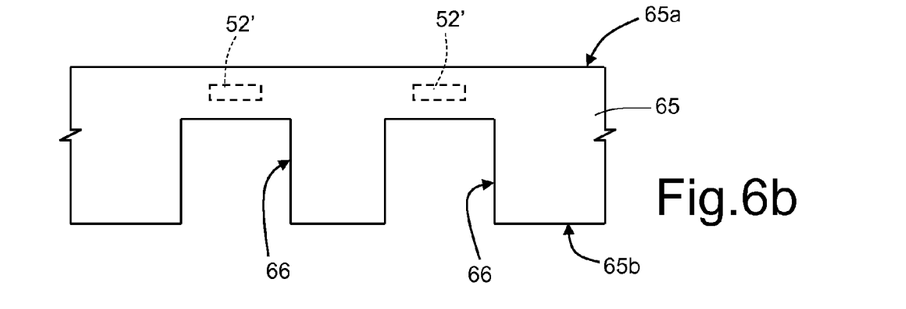
Figure 6C:
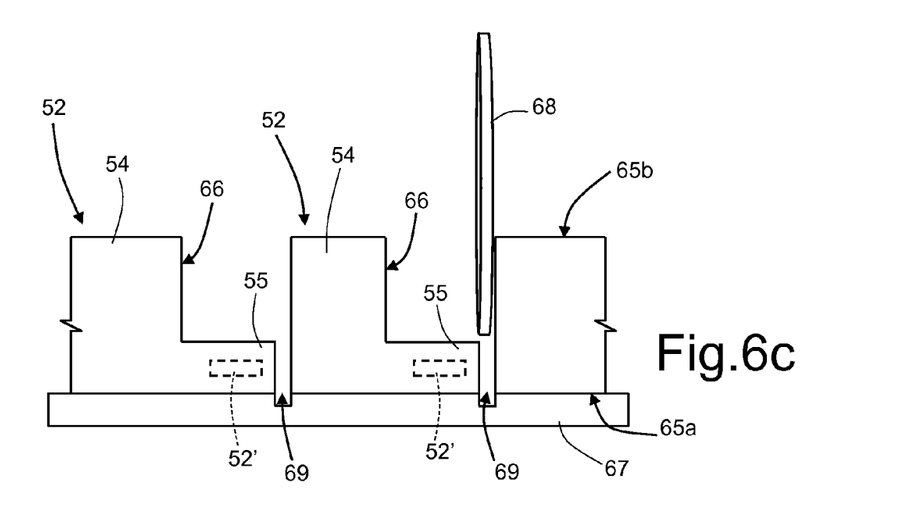

A description of a first variant of a process for manufacturing the second die 52, shaped so as to overlie partially the first die 51 within the package 42, is now provided, with reference to FIGS. 6a-6c.

In detail (FIG. 6a), a plurality of electronic circuits, each including the ASIC 52' (shown schematically) is provided with known micromachining techniques within a wafer 65, including a body of semiconductor material, such as silicon, and moreover further layers of insulating and/or conductive materials on top of the same body.

In particular, the wafer 65 has a front surface 65a and a rear surface 65b, and the electronic circuits are provided at the front surface 65a, appropriately set at a distance from one another, with so-called "front-end" machining techniques.

As shown in FIG. 6b, a removal of material is carried out from the back, for example by means of timed DRIE (deep reactive ion etching), starting from the rear surface 65b, in such a way as to define a plurality of trenches 66 in the wafer 65, each at least partially underneath a corresponding ASIC 52'.

The wafer 65 is turned upside down and set with the front surface 65a in contact with an adhesive film 67 (the so-called "stick foil") in order to undergo the sawing operation for singulation of the wafer 65 into various dice. In particular, using a diamond-saw cutting tool 68, sawing of the wafer 65 is carried out starting from the rear surface 65b, making grooves 69 at a terminal portion of each trench 66 in such a way as to separate and define a plurality of dice, each designed to define a respective second die 52, including the respective supporting portion 54 and the respective functional portion 55, which integrates the respective ASIC 52'.

Each die is then separated from the adhesive film 67, in a known way (here not illustrated), being ready for assembly within the package 42 to obtain the integrated device 40.

Figure 7A:
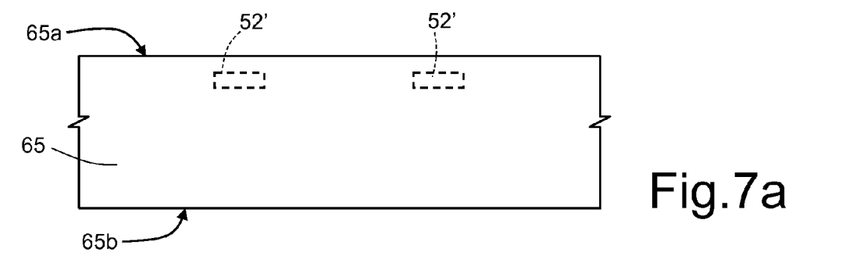
FIGS. 7a-7c are cross-sectional views of a wafer of semiconductor material, in successive steps of a second variant of the process for manufacturing a die of the device of FIG. 4 or FIG. 5.
Figure 7B:
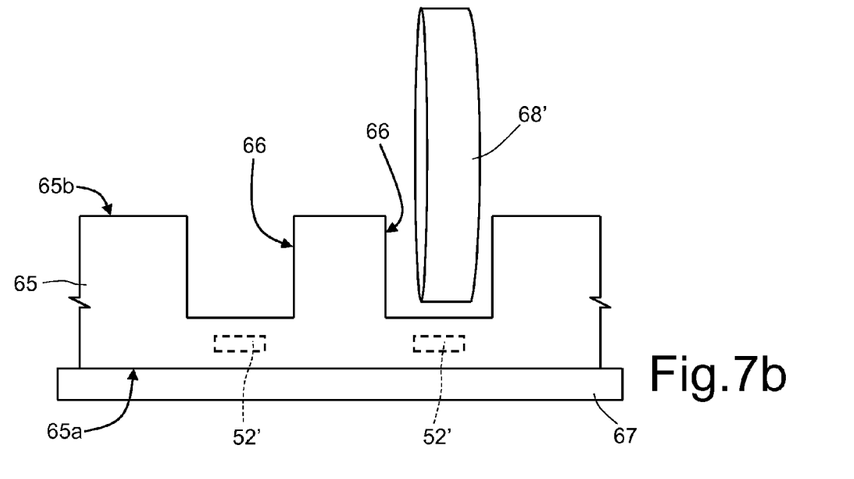
Figure 7C:
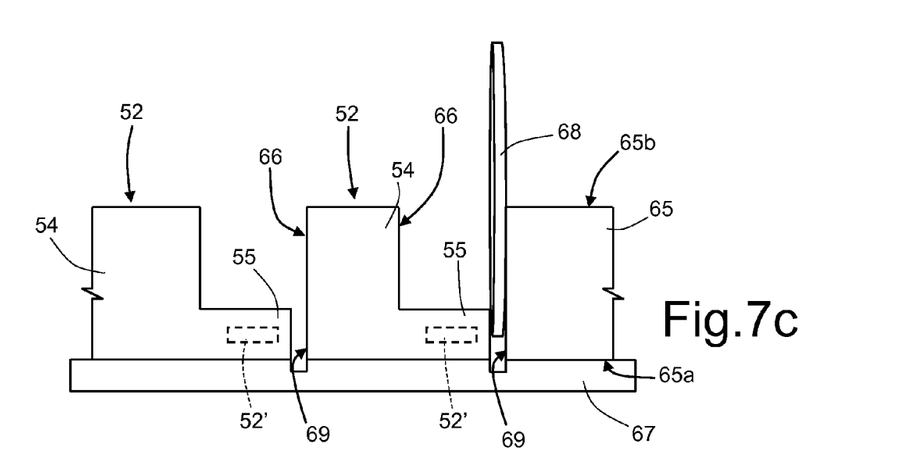

A second variant of the manufacturing process for obtaining the second die 52 is now described with reference to FIGS. 7a-7c.

In a way similar to what has been described for the first variant, the process starts (FIG. 7a), by providing the wafer, once again designated by 65, in which the plurality of electronic circuits, each including the ASIC 52' (shown schematically), has already been made.

The wafer 65 is turned upside down (FIG. 7b), and set with the front surface 65a in contact of the adhesive film 67 to undergo a first sawing operation, with a first cutting tool, here designated by 68', for example of the diamond-saw type, having a first dimension, in particular a first width (in a direction parallel to the rear surface 65b).

The first sawing operation leads to definition of the trenches 66, which extend in the wafer 65 starting from the rear surface 65b.

The wafer 65, once again turned upside down on top of the adhesive film 67, undergoes the sawing operation (FIG. 7c), for singulation into the various dice. In particular, a second cutting tool is used, designated by 68, by analogy with what has been described previously, for example of the diamond-saw type, having a second dimension, in particular a second width (in a direction parallel to the rear surface 65b), smaller than the first width. The grooves 69 are thus dug at a terminal portion of each trench 66 in such a way as to separate and define the dice, each being designed to define a respective second die 52, including the respective supporting portion 54 and the respective functional portion 55, which integrates the respective ASIC 52'.

A third variant of the manufacturing process to obtain the second die 52 is illustrated with reference to FIGS. 8a-8d.

As shown in FIG. 8a, the wafer, once again designated by 65, where the plurality of electronic circuits, each including the ASIC 52' (shown schematically), has already been provided undergoes lapping from the back; then an adhesive tape 70 is laminated on the rear surface 65b, the so-called BG (back-grinding) tape.

The wafer 65 (FIG. 8b) undergoes sawing starting from the front surface 65a, for a depth corresponding substantially to half of the total thickness, to form grooves 71 (that separate in particular adjacent ASICs 52'). Alignment marks 72 are also formed, in the example constituted by through slits that traverse the entire thickness of the wafer 65.

The wafer 65 is turned upside down (FIG. 8c), and set with the front surface 65a in contact with an adhesive film 67, in turn supported, in a known way, by a ring-shaped frame 74 (the so-called "ring"). In this step, the adhesive tape 70 is moreover removed (peeling operation).

Figure 8A:
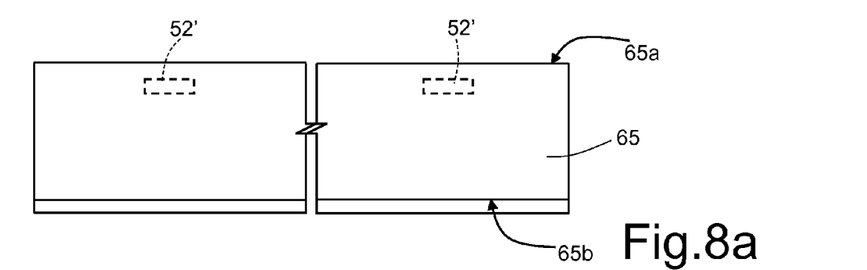
FIGS. 8a-8d are cross-sectional views of a wafer of semiconductor material, in successive steps of a third variant of the process for manufacturing a die of the device of FIG. 4 or FIG. 5.
Figure 8B:
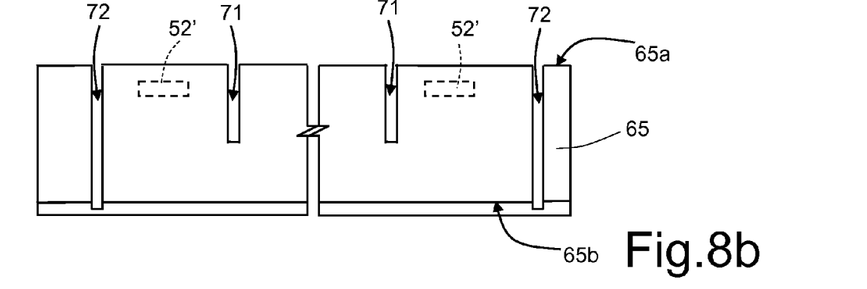
Figure 8C:
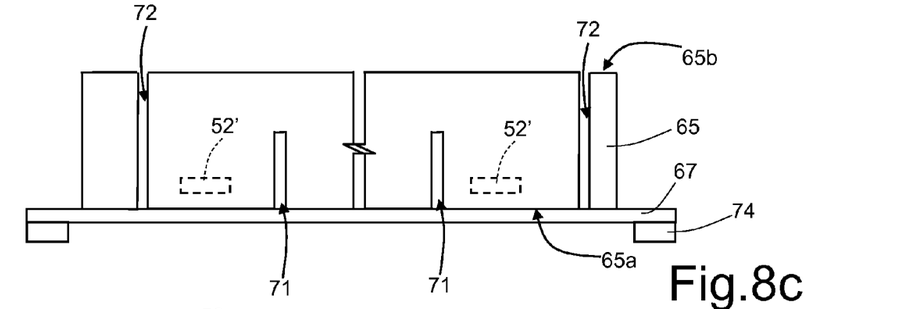
Figure 8D:
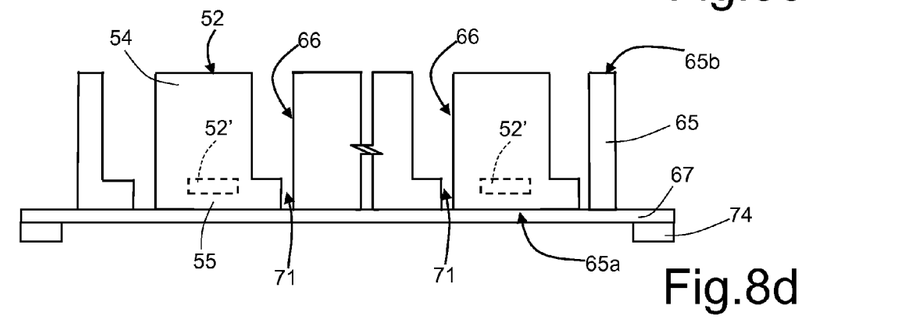

As shown in FIG. 8d, the wafer undergoes the sawing operation starting from the rear surface 65b, which leads to definition of the trenches 66 that extend in the wafer 65, with a depth such as to reach the grooves 71. The various dice are thus defined in the wafer 65, each being designed to define a respective second die 52, including the respective supporting portion 54 and the respective functional portion 55, which integrates the respective ASIC 52'. The aforesaid sawing operation is carried out with reference to the alignment marks 72, suitably visible from the rear surface 65b of the wafer 65.

In a way not illustrated, the various dice are then separated from the adhesive film 67 with known techniques (operation known as "pick and place"), and are then available for the subsequent assembly operation.

Figure 9:
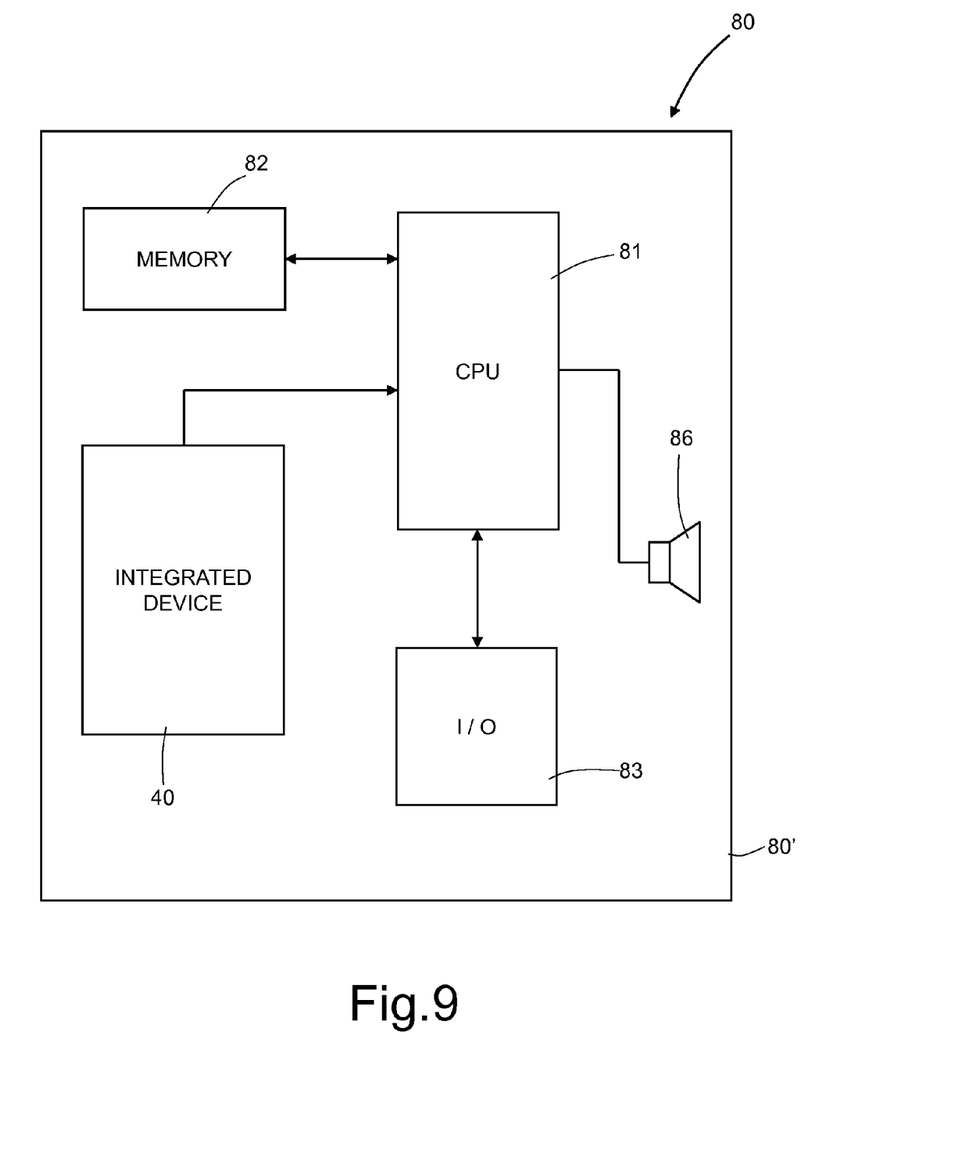
FIG. 9 shows a block diagram of an electronic apparatus including the integrated semiconductor device, according to a further aspect of the present disclosure.

FIG. 9 shows an electronic apparatus 80 using the integrated semiconductor device 40, the package 42 of which is conveniently soldered to a printed circuit board 80' (illustrated schematically), together with the other components of the same electronic apparatus 80.

The electronic apparatus 80 comprises, in addition to the integrated semiconductor device 40, a microprocessor (CPU) 81, a memory block 82, connected to the microprocessor 81, and an input/output interface 83, for example a keyboard and/or a display, which is also connected to the microprocessor 81.

The integrated semiconductor device 40 communicates with the microprocessor 81, and in particular transmits the electrical signals processed by the ASIC associated to the MEMS detection structure.

A loudspeaker 86 may moreover be present, for generating sounds on an audio output (not shown) of the electronic apparatus 80, as a function of the electrical signals coming from the integrated semiconductor device 40 (in the case where the latter provides an acoustic transducer).

The electronic apparatus 80 is preferably a mobile communication device, such as, for example, a cell phone, a PDA, a notebook, but also a voice recorder, a reader of audio files with voice recording operation, a console for videogames, a hydrophone, etc.

One or more advantages of the proposed assembly for the integrated semiconductor device, and of the related manufacturing process, are clear from the foregoing description.

In particular, it is once again emphasized that the particular arrangement and conformation of the dice within the package enables reduction of the encumbrance of the integrated device, in particular in the horizontal plane, hence enabling particularly compact dimensions to be achieved.

As compared to traditional solutions, the solution described is simple to implement, in so far as the superposition in the vertical direction is obtained by means of standard techniques of machining of a wafer of semiconductor material and of package assembly.

Moreover, the solution described affords a greater degree of freedom in the definition of the spaces and of dimensions; for example, in the case of a MEMS acoustic transducer, it is possible to obtain a large volume for the back chamber of the transducer.

Finally, it is clear that modifications and variations may be made to what has been described and illustrated herein without thereby departing from the scope of the present disclosure.

For example, a different geometrical configuration of the elements of the assembly may be envisaged, for example as regards the second die 52, which in any case guarantees vertical superposition.

Moreover, further variations of the related manufacturing process may be envisaged. For example, the functional portion 55 could be provided in a body distinct from that of the supporting portion 54, being coupled thereto with standard techniques (for example, by means of adhesive bonding) to obtain the desired structure.

Moreover, in an evident way, the solution of assembly described advantageously applies to any integrated device including at least two dice of semiconductor material, enabling reduction of the encumbrance of the corresponding package. In particular, in the case where no fluid communication with the external environment is utilized, the package may clearly not envisage an access opening towards the outside.

All of the U.S. patents applications and publications referred to in this specification are incorporated herein by reference, in their entirety. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor integrated device assembly, comprising:
    a package having an inner surface and an internal space located above the inner surface;
    a first die including semiconductor material coupled to the inner surface; and
    a second die including semiconductor material and having a first portion above and extending along a first side of the first die and a second portion that extends along and overlaps a second side of the first die, the first side being transverse from the second side.

2. The assembly according to claim 1, wherein said first die integrates a micromechanical detection structure, and said second die integrates an ASIC that is functionally coupled to said micromechanical detection structure.

3. The assembly according to claim 1, wherein said second portion is spaced apart from the first die, and said second portion is supported by said first portion in such a way as to be suspended as a cantilever at a distance from said inner surface and a distance from said first die.

4. The assembly according to claim 3, wherein said first portion and said second portion are an integral part of a body.

5. The assembly according to claim 1, wherein said second portion integrates an ASIC and has an outer surface, said second portion having first connection pads located on said outer surface and facing away from said first die; and
    the assembly further including electrical-connection wires between said first connection pads and respective connection pads carried by a respective outer surface of said first said first die.

6. The assembly according to claim 3, wherein said first portion has a vertical dimension, along a direction that is orthogonal to said inner surface.

7. The assembly according to claim 1, wherein:
    said package comprises a base substrate and a cap element that together define said internal space;
    said base substrate has an outer surface facing outward of said internal space, the outer surface having electrical contacts, and said cap element is cup-shaped; and
    said inner surface is an inner wall of said cap element facing said internal space.

8. The assembly according to claim 1, wherein:
    said package comprises a base substrate and a cap element that together define said internal space;
    said base substrate has an outer surface facing outward of said internal space, the outer surface having electrical contacts, and said cap element is cup-shaped; and
    said inner surface is an inner wall of said base substrate facing said internal space and opposite to said outer surface.

9. The assembly according to claim 7, wherein:
    said package has an access opening through at least one of said base substrate and said cap element, the access opening being configured to place said internal space in communication with an external environment;
    said first die integrates a MEMS acoustic transducer that includes a membrane suspended above a cavity and facing a rigid plate; and said first die being arranged between said access opening and said internal space with said cavity in fluid communication with said access opening.

10. The assembly according to claim 7, wherein:
said cap element is cup-shaped with side walls, said side walls being coupled to said base substrate by coupling elements that includes conductive material; and
said coupling elements and contact regions carried by said side walls provide electrical connections between said second die and said base substrate.

11. An electronic apparatus, comprising:
a package having a body that defines an internal space and has at least one inner surface;
a first semiconductor die coupled to the at least one inner surface; and
a second semiconductor die having a first portion coupled to the at least one inner surface and having a second portion that is supported by the first portion as a cantilever that is located above and is spaced apart from said first die.

12. The electronic apparatus according to claim 11, wherein the electronic apparatus is one of a cell phone, a PDA, a notebook, a voice recorder, an audio reader with voice recorder functions, a console for videogames, and a hydrophone.

13. The electronic apparatus according to claim 11, wherein said first die integrates a micromechanical detection structure, and said second die integrates an ASIC that is functionally coupled to said micromechanical detection structure.

14. The electronic apparatus according to claim 13, wherein said ASIC is located in the second portion of the second semiconductor die.

15. The electronic apparatus according to claim 14, further comprising:
first connection pads located on said second portion of the second semiconductor die;
second connection pads located on a surface of the first semiconductor die; and
electrical connection wires coupled at one end to said first connection pads and at another end to the second connection pads.

16. A process, comprising:
coupling a first semiconductor die to an inner surface of a package, an upper surface of the first semiconductor die facing an internal space of said package;
arranging a second semiconductor die in the package in a position that includes a first portion proximate the inner surface of the package and a second cantilevered portion overlapping the upper surface of the first semiconductor die; and
coupling the first portion of the second semiconductor die to the inner surface in the position.

17. The process according to claim 16, further comprising forming said second die by forming the second portion as a cantilever that is suspended from said first portion.

18. The process according to claim 17, wherein forming said second die comprises:
providing a wafer of semiconductor material having a front face and a rear face;
forming ASIC electronic circuits at said front face;
forming trenches in said wafer starting from said rear face; and
cutting said wafer at a terminal portion of said trenches in such a way as to obtain a plurality of dice, each forming said second die.

19. The process according to claim 18, wherein forming trenches comprises using a first cutting tool, having a first width, to cut into said rear face;
and wherein said cutting said wafer comprises using a second cutting tool, having a second width, smaller than the first width.

20. The process according to claim 17, wherein said forming said second die comprises:
providing a wafer of semiconductor material, having a front face and a rear face;
forming ASIC electronic circuits at said front face;
forming grooves starting from said front face between mutually adjacent ASIC electronic circuits; and
cutting said wafer starting from said rear face to form trenches reaching respective grooves in such a way as to obtain a plurality of dice, each forming said second die.

* * * * *

UNITED STATES PATENT AND TRADEMARK OFFICE
CERTIFICATE OF CORRECTION

PATENT NO. : 8,836,111 B2  
APPLICATION NO. : 13/916416  
DATED : September 16, 2014  
INVENTOR(S) : Sebastiano Conti et al.

Page 1 of 1

It is certified that error appears in the above-identified patent and that said Letters Patent is hereby corrected as shown below:

In the claims

Column 10, Lines 37-39:
"between said first connection pads and respective connection pads carried by a respective outer surface of said first said first die." should read, --between said first connection pads and respective connection pads carried by a respective outer surface of said first die.--.

Signed and Sealed this
Fifteenth Day of December, 2015

Michelle K. Lee
*Director of the United States Patent and Trademark Office*